(12) United States Patent
Tochi et al.

(10) Patent No.: US 7,247,975 B2
(45) Date of Patent: Jul. 24, 2007

(54) THIN-FILM PIEZOELECTRIC ELEMENT AND METHOD OF MAKING SAME

(75) Inventors: Kenichi Tochi, Tokyo (JP); Takao Noguchi, Tokyo (JP); Hiroshi Yamazaki, Tokyo (JP); Ken Unno, Tokyo (JP); Masahiro Miyazaki, Tokyo (JP); Shigeru Shoji, Tokyo (JP)

(73) Assignee: TDK Corporation, Tokyo (JP)

( * ) Notice: Subject to any disclaimer, the term of this patent is extended or adjusted under 35 U.S.C. 154(b) by 162 days.

(21) Appl. No.: 11/078,565

(22) Filed: Mar. 14, 2005

(65) Prior Publication Data

US 2005/0212389 A1  Sep. 29, 2005

(30) Foreign Application Priority Data

Mar. 29, 2004  (JP)  ............... 2004-096674

(51) Int. Cl.
*H01L 41/08*  (2006.01)
(52) U.S. Cl. ............... 310/328; 310/340; 310/364; 310/366
(58) Field of Classification Search ............... 310/328, 310/340, 366
See application file for complete search history.

(56) References Cited

U.S. PATENT DOCUMENTS

| | | | | |
|---|---|---|---|---|
| 5,126,618 A | * | 6/1992 | Takahashi et al. | ............ 310/346 |
| 5,161,728 A | * | 11/1992 | Li | ............ 228/124.1 |
| 6,182,340 B1 | * | 2/2001 | Bishop | ............ 29/25.35 |
| 6,290,315 B1 | * | 9/2001 | Sayama | ............ 347/10 |
| 6,411,012 B2 | * | 6/2002 | Furukawa et al. | ............ 310/328 |

FOREIGN PATENT DOCUMENTS

| | | |
|---|---|---|
| JP | B2 3310881 | 4/1997 |
| JP | A 11-312801 | 11/1999 |
| JP | A 2001-313429 | 11/2001 |
| JP | A 2002-164586 | 6/2002 |
| JP | A 2003-229611 | 8/2003 |

* cited by examiner

*Primary Examiner*—Mark Budd
(74) *Attorney, Agent, or Firm*—Oliff & Berridge, PLC

(57) ABSTRACT

Provided is a thin-film piezoelectric element which reduces the influence of an oxide film left on the electrode film on the degradation of element characteristics, and a method of making the thin-film piezoelectric element. The thin-film piezoelectric element has $ZrO_2$ as the main component of the outermost layer of the oxide film which covers the laminate. Young's modulus of the $ZrO_2$ is 190 GPa, giving a significantly low value compared with Young's modulus of MgO, 245 GPa. Consequently, the influence of the oxide film on the reduction in the displacement magnitude of the piezoelectric film is smaller than the influence of the MgO thin film left in the conventional thin-film piezoelectric element. As a result, the thin-film piezoelectric element decreases the influence of the oxide film on the degradation of element characteristics compared with the conventional thin-film piezoelectric element.

5 Claims, 4 Drawing Sheets

THIN-FILM PIEZOELECTRIC ELEMENT AND METHOD OF MAKING SAME

BACKGROUND OF THE INVENTION

1. Field of the Invention

The present invention relates to a thin-film piezoelectric element having a piezoelectric thin film and a method of making same.

2. Related Background of the Invention

A thin-film piezoelectric element in the field of this technology is disclosed, for example, in Japanese Patent Laid-Open No. 2003-229611. To manufacture the thin-film piezoelectric element disclosed in the patent publication, firstly two sheets of silicon substrates are prepared, and a film of MgO preferentially oriented on a (200) plane is formed on the surface of each substrate. Secondly, a first electrode film, a piezoelectric film, and a second electrode film are laminated in this order on each of the substrate having the formed MgO film thereon to prepare two sheets of laminate substrates. Thirdly, these two laminate substrates are stuck together using an adhesive in a position in which the respective electrode films face with each other. Fourthly, only one silicon substrate is removed by etching, followed by forming an electrode pattern on the surface exposed by the removal of the silicon substrate. After that, the other silicon substrate is removed by etching, thus to complete the making of the thin-film piezoelectric element. Even after removing the silicon substrate by etching, however, the MgO film is left on the top and bottom surfaces of the thin-film piezoelectric element.

The above-described conventional thin-film piezoelectric element has, however, problems. That is, as described in the patent publication, the MgO film degrades the characteristics of the element because the MgO thin film left on the thin-film piezoelectric element decreases the displacement magnitude of the piezoelectric film. Although the patent publication describes the improvement in the displacement magnitude of a piezoelectric film by removing the MgO film, the treatment needs additional work and time, which increases the manufacturing time and cost.

The present invention was completed to solve the above problems, and an object of the present invention is to provide a thin-film piezoelectric element which reduces the influence of the oxide film left on the electrode film on the degradation of the element characteristics, and to provide a method of making same.

SUMMARY OF THE INVENTION

The thin-film piezoelectric element according to the present invention comprises a laminate consisted of a plurality of piezoelectric laminates stacking on each other via an adhesive layer, each of which piezoelectric laminates having a structure wherein a piezoelectric film is sandwiched a pair of electrode films, wherein the laminate is covered with an oxide film having a structure of one or more layers, and an outermost layer of the oxide film has $ZrO_2$ as a main component.

In the thin-film piezoelectric element, the main component of the outermost layer of the oxide film which covers the laminate is $ZrO_2$. Young's modulus of the $ZrO_2$, (190 GPa), is significantly lower than that of MgO, (245 GPa). Accordingly, the influence of the oxide film on the reduction in the displacement magnitude of the piezoelectric film is less than the influence of the MgO thin film left in the conventional thin-film piezoelectric element. As a result, in the thin-film piezoelectric element, the influence of the oxide film on the degradation of element characteristics is smaller than that of the conventional thin-film piezoelectric element. Furthermore, compared with the conventional thin-film piezoelectric element, the thin-film piezoelectric element significantly improves the displacement magnitude of the piezoelectric film so that there is no need of the step of removing the oxide film, which step takes separate work and time.

It is preferable that the electrode film is made of at least one of the materials selected from the metallic material group consisting of Pt, Au, Ir, Pd, Rh, Cu, and Ag.

It is preferable that the electrode film of the pair of electrode films that is adjacent to the oxide film is a <100>-oriented film.

It is preferable that the piezoelectric film is a c-plane single-oriented thin film. And it is preferable that the piezoelectric film includes at least one of lead zirconate titanate, lead strontium titanate, and lead titanate.

The method of making the thin-film piezoelectric element according to the present invention comprises a step of bonding two laminated substrates together by an adhesive, each of which laminated substrates is obtained by laminating, in this order, a $ZrO_2$ film having $ZrO_2$ as a main component, a first metallic film, a piezoelectric film, and a second metallic film, all prepared by epitaxial growth, on two Si single-crystal substrates respectively exposing the (100) plane on the surface thereof, the second metallic films opposing each other; and, a step of etching away at least one of the Si single-crystal substrates from the two laminated substrates bonded together by the adhesive.

The thin-film piezoelectric element made by the method of making thereof leaves a $ZrO_2$ film having $ZrO_2$ as the main component on the top and bottom surfaces thereof after etching away the Si single-crystal substrate. Young's modulus of the $ZrO_2$, (190 GPa), is significantly lower than that of MgO, (245 GPa). Accordingly, the influence of the $ZrO_2$ film on the reduction in the displacement magnitude of the piezoelectric film is less than the influence of the MgO thin film left in the conventional thin-film piezoelectric element. As a result, in the thin-film piezoelectric element, the influence of the oxide film on the degradation of element characteristics is smaller than that of the conventional thin-film piezoelectric element. Furthermore, compared with the conventional thin-film piezoelectric element, the thin-film piezoelectric element significantly improves the displacement magnitude of the piezoelectric film so that there is no need of the step of removing the oxide film, which step takes separate work and time.

According to the present invention, there is provided a thin-film piezoelectric element which decreases the influence of the oxide film left on the electrode film on the degradation of element characteristics, and a method of making same.

DESCRIPTION OF THE PREFERRED EMBODIMENTS

Figure 1:
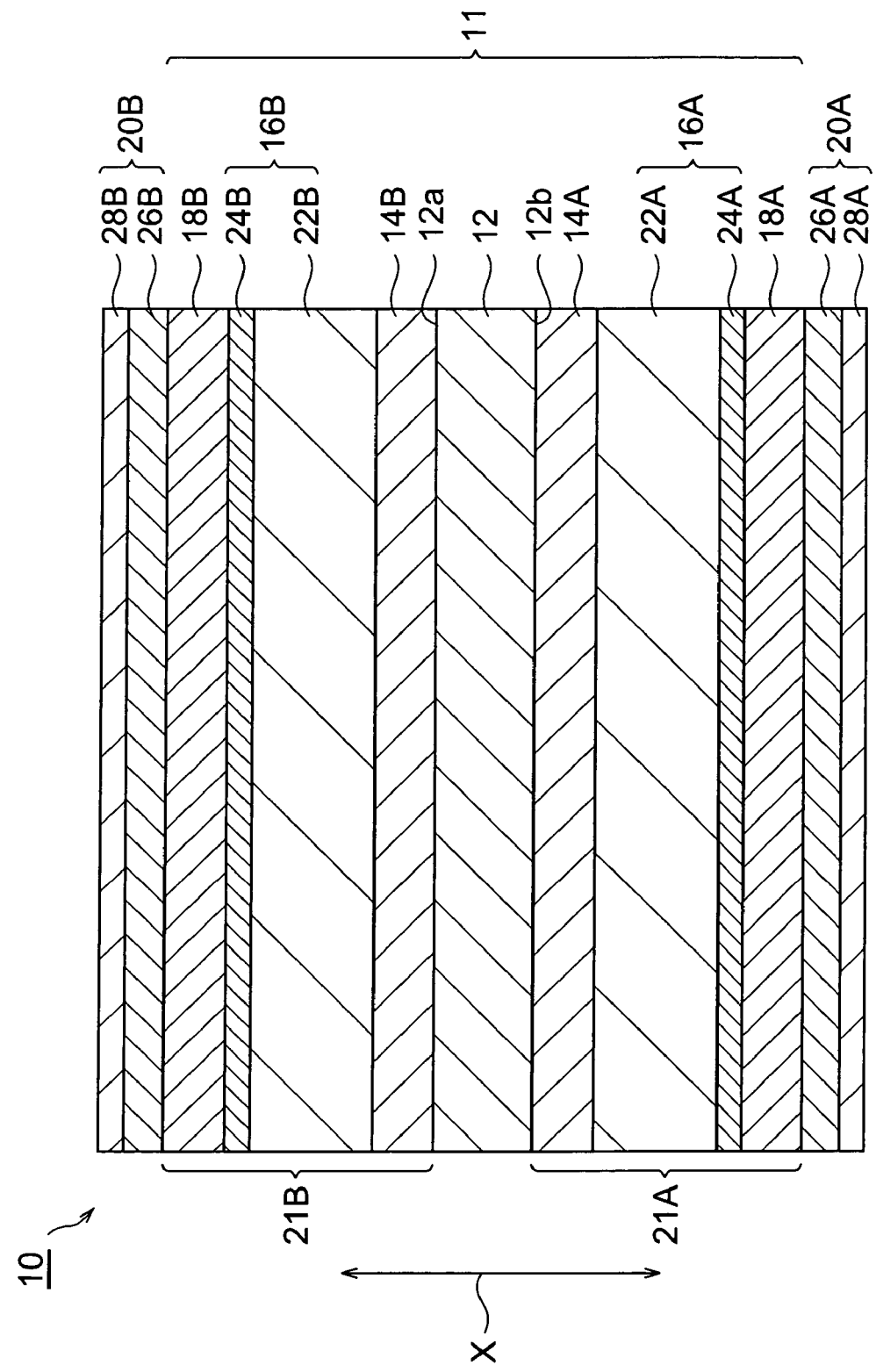
FIG. 1 is a schematic drawing of cross sectional view of the thin-film piezoelectric element in an embodiment according to the present invention.

The following is a detailed description of the presumably best embodiment for carrying out the present invention in terms of the thin-film piezoelectric element and of the method of making same referring to the drawings. In the embodiment and the drawings, the same and similar element has the same reference number, and no duplicated description is given.

First, the thin-film piezoelectric element according to the embodiment of the present invention is described referring to FIG. 1. As shown in FIG. 1, a thin-film piezoelectric element 10 has an adhesive film (adhesive layer) 12 at the center in the laminate direction (X-direction in FIG. 1), giving a symmetrical laminate structure centering on the adhesive film 12. That is, on each of a top surface 12a and a bottom surface 12b of the adhesive film 12, films structured by the same material are laminated in the same order, respectively. The order of stacked films is, from the closest position to the adhesive film 12, electrode films (second metallic film) 14A and 14B, piezoelectric films 16A and 16B, electrode films (first metallic film) 18A and 18B, and oxide films 20A and 20B, respectively.

In concrete terms, in the thin-film piezoelectric element 10, a piezoelectric laminate 21A has a pair of electrode films 14A and 18A, which sandwich the piezoelectric film 16A therebetween, and two of the piezoelectric laminates stack together via the adhesive film 12. Thus formed two stages of piezoelectric laminates 21A and 21B and the adhesive film 12 structure a laminate 11. The thin-film piezoelectric element 10 has the oxide films 20A and 20B covering each surface of the laminate 11.

The adhesive film 12 is made from an insulating adhesive. The electrode films 14A and 14B and the electrode films 18A and 18B are epitaxial films made of Pt, having the <100> growth direction (thickness direction, or X-direction in FIG. 1).

The piezoelectric films 16A and 16B are formed by two layers, or PZT films 22A and 22B and PLT films 24A and 24B, respectively, the PZT films 22A and 22B being placed closer to the adhesive film 12. The PZT films 22A and 22B are epitaxial films made of lead zirconate titanate (PZT), and the PLT films 24A and 24B are epitaxial films made of La-doped lead titanate (PLZ). Both of these PZT films 22A and 22B and PLT films 24A and 24B have the <001> growth direction (thickness direction, or X-direction in FIG. 1), giving c-plane single orientation. That is, the piezoelectric films 16A and 16B are piezoelectric films of perovskite type.

The oxide films 20A and 20B are formed by two layers of $Y_2O_3$ films 26A and 26B and $ZrO_2$ films 28A and 28B, respectively, the $Y_2O_3$ films 26A and 26B being positioned closer to the adhesive film 12. The $Y_2O_3$ films 26A and 26B are epitaxial films made of yttrium oxide ($Y_2O_3$), and the $ZrO_2$ films 28A and 28B are epitaxial films made of zirconium oxide ($ZrO_2$). The growth plane of the $Y_2O_3$ films 26A and 26B is the (100) plane, and that of the $ZrO_2$ films 28A and 28B is the (001) plane.

Next, the method of making the thin-film piezoelectric element 10 is described below.

Figure 2:
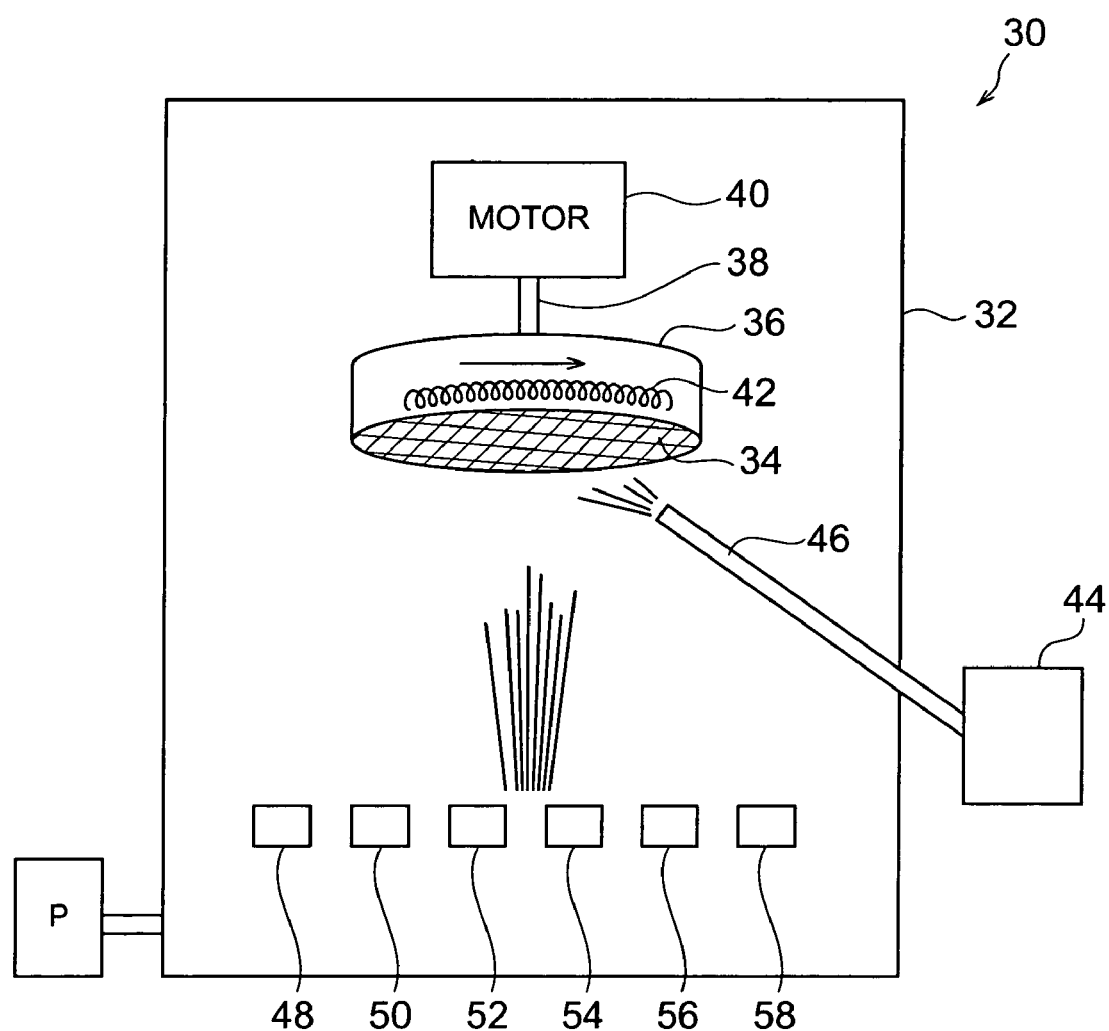
FIG. 2 shows a thin-film manufacturing apparatus used for making the thin-film piezoelectric element of FIG. 1.

Referring to FIG. 2, the manufacturing apparatus (vapor deposition apparatus) used for making the thin-film piezoelectric element 10 is described in the following.

As shown in FIG. 2, a vapor deposition apparatus 30 has a vacuum tank 32. The vacuum tank 32 contains a holder 36 at lower section thereof to hold a Si single-crystal substrate 34. The holder 36 is connected to a motor 40 via a rotary shaft 38, and is driven by the motor 40 to rotate the Si single-crystal substrate 34 in the plane of the substrate. The holder 36 has a built-in heater 42 to heat the Si single-crystal substrate 34.

The vapor deposition apparatus 30 has a gas-feed unit 44 to feed an oxidizing gas. A feed throat 46 of the gas-feed unit 44 is located directly beneath the holder 36. As a result, the oxidizing gas increases the partial pressure near the Si single-crystal substrate 34. The oxidizing gas may be oxygen, ozone, atomic oxygen, or $NO_2$.

Further below the holder 36, there are arranged a Zr vaporization section 48, a Y vaporization section 50, a Pt vaporization section 52, a Pd vaporization section 54, a Ti vaporization section 56, and a La vaporization section 58. Each of these Zr vaporization section 48, Y vaporization section 50, Pt vaporization section 52, Pd vaporization section 54, Ti vaporization section 56, and La vaporization section 58 has each metallic source and an energy supply unit (electron beam generator, resistance heating unit, and the like) to supply energy to the metallic source for evaporating the metal. FIG. 2 shows a vacuum pump P.

Figure 3:
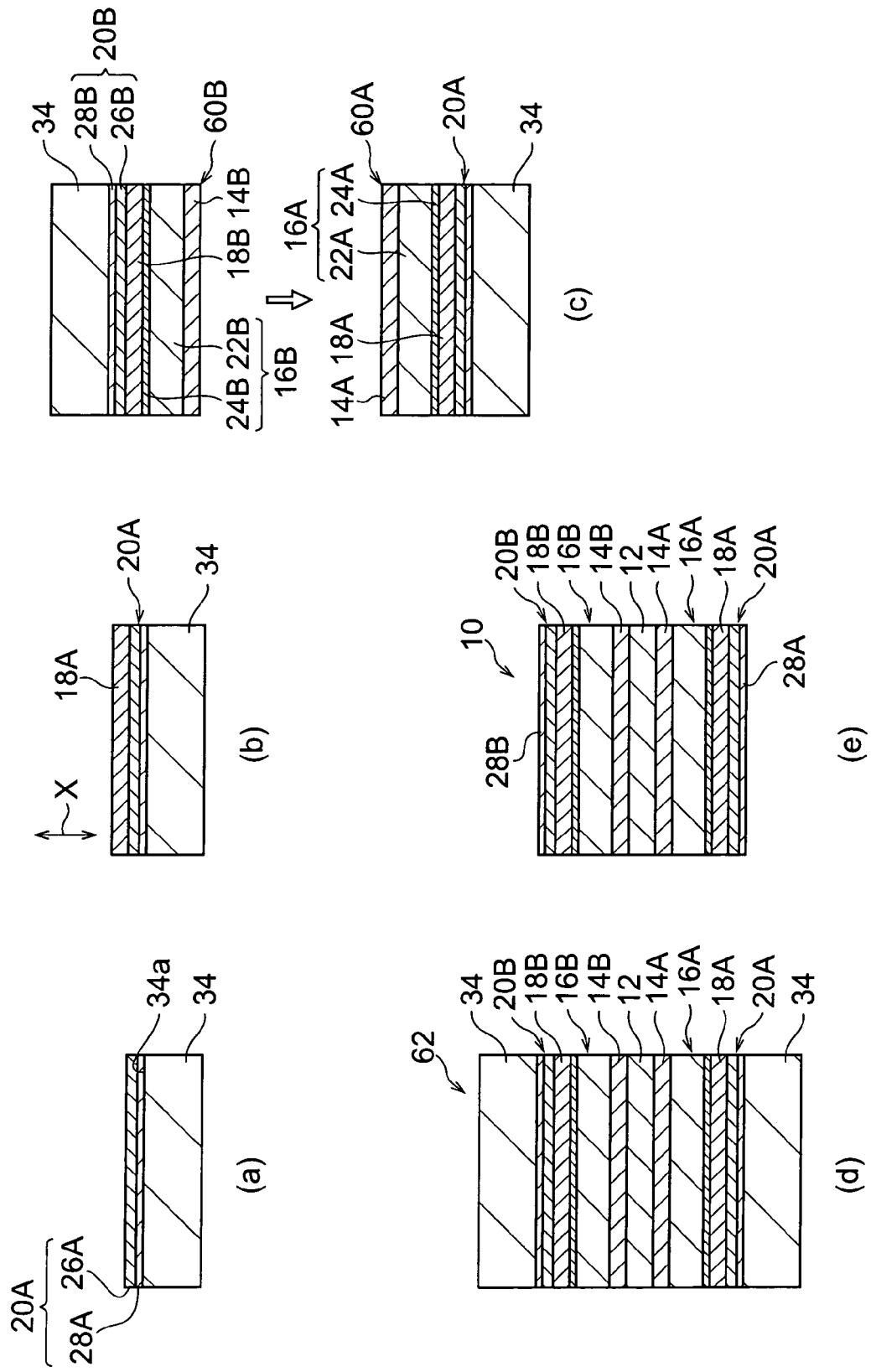
FIG. 3 illustrates the procedure of making the thin-film piezoelectric element of FIG. 1.

Referring to FIG. 3, the procedure for making the thin-film piezoelectric element 10 is described below.

First, the Si single-crystal substrate 34 is installed to the holder 36 of the vapor deposition apparatus 30 so that a substrate surface 34a exposing the (100) plane faces downward.

The substrate surface 34a is preferably cleaned by etching using a mirror-finished wafer. The cleaning by etching is done by a 40% ammonium fluoride aqueous solution or the like. Since the cleaned Si single-crystal substrate 34 shows extremely strong reactivity, it is preferable to apply a specific surface treatment to protect the surface from reorientation and contamination.

Secondly, the oxide film 20A is formed on the surface 34a of the substrate 34 by the sequential epitaxial growth of $ZrO_2$ film 28A having a thickness of 0.01 μm and of $Y_2O_3$ film 26A having a thickness of 0.04 μm, (refer to FIG. 3(a)). Specifically, the film-forming is carried out by feeding Zr from the Zr vaporization section 48 and Y from the Y vaporization section 50 to the surface 34a of the Si single-crystal substrate 34 which is heated to 400° C. or above while feeding the above-described oxidizing gas, thus forming the $ZrO_2$ film 28A and the $Y_2O_3$ film 26A. The growth plane of thus formed epitaxially grown $ZrO_2$ film 28a is the (001) plane, and that of the $Y_2O_3$ film 26A is the (100) plane.

When the substrate area becomes 10 cm$^2$ or more, or for example, when the film is formed on a large area of single-crystal substrate having a diameter of 2 inches, the high oxygen partial pressure can be applied over the whole area of the substrate by rotating the substrate 34 by the motor 40 to achieve the film-forming on a large area. In that case, the rotational speed of the substrate is preferably 10 rpm or more because a low rotational speed induces distribution in the film thickness within the substrate plane. Although the upper limit of the rotational speed of the substrate is not specifically limited, normally the upper limit thereof is about 120 rpm considering the mechanism of the vacuum unit.

Secondly, the electrode film 18A having a thickness of 0.2 μm is epitaxially grown on the oxide film 20A, (refer to FIG. 3(b)). In concrete terms, the electrode film 18A is formed on the top surface of the Si single-crystal substrate 34 by feeding Pt from the Pt vaporization section 52. Thus the epitaxially-grown electrode film 18A is oriented in the <100> direction.

Furthermore, by epitaxially growing sequentially the PLT film 24A having a thickness of 0.02 μm and the PZT film 22A having a thickness of 2.5 μm on the electrode film 18A, the piezoelectric film 16A is formed. In detail, the PLT film 24A and the PZT film 22A are formed by selectively feeding Ti from the Ti vaporization section 56, Pd from the Pd vaporization section 54, La from the La vaporization section 58, and Zr from the Zr vaporization section 48 on the heated Si single-crystal substrate 34 while feeding the above-described oxidizing gas. Thus the epitaxially-grown PLT film 24A and PZT film 22A are oriented in the <001> direction.

Thirdly, the electrode film 14A having a thickness of 0.2 μm is epitaxially grown on the piezoelectric film 16A, (refer to FIG. 3(c)). In more detail, the electrode film 14A is formed on the top surface of the Si single-crystal substrate 34 by feeding Pt from the Pt vaporization section 52.

Thus the manufacture of a laminate substrate 60A is completed. The laminate substrate 60A has the structure of the Si single-crystal substrate 34 having the sequentially stacked oxide film 20A, electrode film 18A, piezoelectric film 16A, and electrode film 14A, in this order. Separately, a sheet of substrate (laminate substrate 60B) which is the same as the laminate substrate 60A is prepared. That is, a laminate substrate 60B has the structure of the Si single-crystal substrate 34 on which the oxide film 20B ($ZrO_2$ film 28B and $Y_2O_3$ film 26B), the electrode film 18B, the piezoelectric film 16B (PLT film 24B and PZT film 26B), and the electrode film 14B, (corresponding to the oxide film 20A, the electrode film 18A, the piezoelectric film 16A, and the electrode film 14A on the laminate substrate 60A, respectively), are stacked in this order.

After taking out the laminate substrates 60A and 60B from the manufacturing apparatus 30, the laminate substrate 60A and the laminate substrate 60B are stuck together via an adhesive so that the electrode film 14A which is the uppermost film of the laminate substrate 60A and the electrode film 14B which is the uppermost film of the laminate substrate 60B overlap with each other, (refer to FIG. 3(d)). Thus, there is formed a laminate structure 62 having the structure of the adhesive film 12 as the center, and of the sequentially stacked electrode films 14A and 14B, piezoelectric films 16A and 16B, electrode films 18A and 18B, oxide films 20A and 20B, and Si single-crystal substrates 34, respectively in this order at the respective sides of the adhesive film 12.

Finally, the Si single-crystal substrates 34 on both sides of the laminate substrate 62 are removed using an etching liquid such as alkali solution such as that of potassium hydroxide, hydrofluoric acid, and fluorine nitrate to complete the manufacture of the thin-film piezoelectric element 10, (refer to FIG. 3(e)). When an electrode pattern is formed on the surface of the thin-film piezoelectric element 10, the silicon substrate 34 only on one side may firstly be removed by etching for readily forming the electrode pattern, thus forming the electrode pattern on the exposed surface, followed by removing the silicon substrate 34 on the other side by etching.

The manufactured thin-film piezoelectric element 10 has the remaining oxide films 20A and 20B, which function as the buffer layer on forming the electrode films 18A and 18B, respectively, on the respective Si single-crystal substrates 34. The oxide films 20A and 20B have the outermost layers of $ZrO_2$ films 28A and 28B, respectively. Young's modulus of $ZrO_2$ of the $ZrO_2$ film is about 190 GPa. On the other hand, Young's modulus of MgO left on the outermost face of the conventional thin-film piezoelectric element is about 245 GPa. That is, the $ZrO_2$ left on the outermost side of the thin-film piezoelectric element 10 is more likely to deform than the MgO left at the outermost side of the conventional thin-film piezoelectric element. Accordingly, the influence of the $ZrO_2$ films 28A and 28B left as the outermost films of the thin-film piezoelectric element 10 on the reduction in the displacement magnitude of piezoelectric film is smaller than the influence of the MgO film in the conventional thin-film piezoelectric element. Consequently, in the thin-film piezoelectric element 10, the influence of outermost film on the degradation of element characteristics decreases.

Since MgO has a strong hydrophilic property, a conventional thin-film piezoelectric element which contains remaining MgO is requested to have a special measure to prevent adsorption of water on the thin-film surface, which results in very poor handling performance. To the contrary, the $ZrO_2$ film left in the thin-film piezoelectric element 10 has not a strong hydrophilic property so that no above-described special measures is required, thus attaining excellent handling performance.

Figure 4:
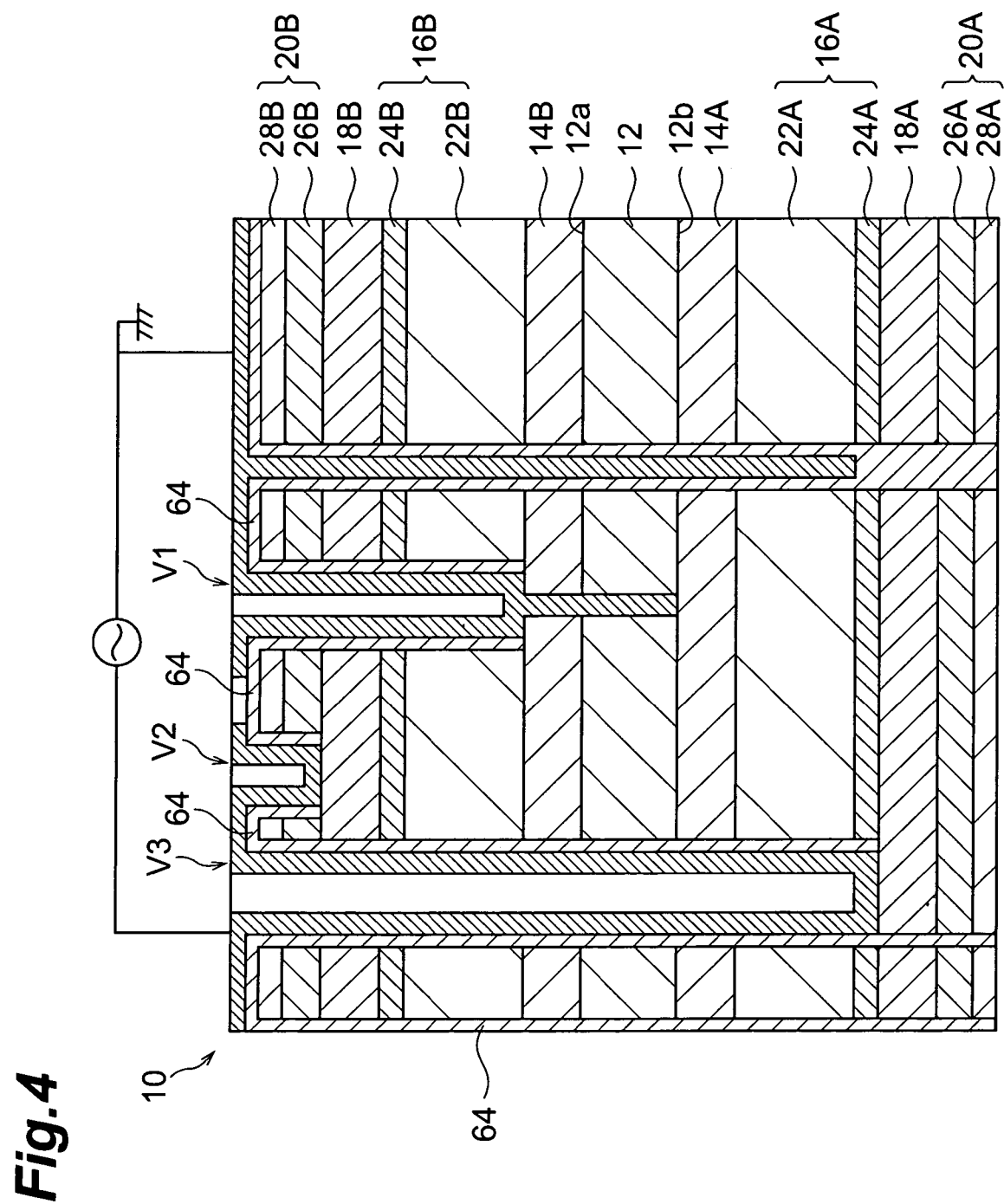
FIG. 4 shows an example of the mode for structuring the electrode in the thin-film piezoelectric element of FIG. 1.

On using the thin-film piezoelectric element 10, an alternate current voltage is applied between, for example, the electrodes 14A and 14B and the electrodes 18A and 18B, respectively. At this moment, the alternate current voltage is applied between, for example, the electrodes 14A and 14B and the electrodes 18A and 18B, respectively, by forming specified respective via in the thin-film piezoelectric element 10, as shown in FIG. 4. That is, a terminal at one side of the alternate current power source connects with the electrode film 14A and the electrode film 14B via a via V1 which extends to the electrode film 14A while establishing the conduction with the electrode film 14B. A terminal at the other side of the alternate current power source connects with the electrode film 18A and the electrode film 18B via a via V2 which extends to the electrode film 18B and a via V3 which extends to the electrode film 18A. Each side face of via V1, V2, and V3, and the surface of the element 10 are covered with respective insulation films 64 which are normally made of polyimide.

Present invention is not limited to the above-described embodiment, and various modifications are applicable. For example, the oxide film is not limited to the two-layer structure, and a single layer structure consisting of only a $ZrO_2$ film, or three or more layers structure with other layers being added may be applied. The material of the electrode film is not limited to Pt, and other material may be applied if only the material contains, for example, at least one metal selected from the group consisting of Au, Ir, Pd, Rh, Cu, and Ag. Furthermore, the piezoelectric film is not limited to the above-described structure, if at least one of layers of the piezoelectric film is a c-plane single-oriented thin film which includes one of the following: lead zirconate titanate, lead strontium titanate and lead titanate as the main component. For example, either a single layer structure or a plural layer structure in which one or more layers are made of any other material may be adopted. In addition, the piezoelectric film may have a functionally gradient structure consisting the above-described materials and any other materials. In addition, manufacture of the thin-film piezoelectric element may employ another manufacturing apparatus than that given above, and, for example, a sputtering apparatus and an MBE apparatus may be applied.

What is claimed is:

1. A thin-film piezoelectric element comprising a laminate consisted of a plurality of piezoelectric laminates stacking on each other via an adhesive layer, each of which piezoelectric laminates having a structure wherein a piezoelectric film is sandwiched between a pair of electrode films, wherein the laminate is covered with an oxide film having a structure of one or more layers, and an outermost layer of the oxide film has $ZrO_2$ as a main component.

2. The thin-film piezoelectric element as in claim 1, wherein the electrode film is made of at least one of the materials selected from the metallic material group consisting of Pt, Au, Ir, Pd, Rh, Cu, and Ag.

3. The thin-film piezoelectric element as in claim 1, wherein the electrode film of the pair of electrode films that is adjacent to the oxide film is a <100>-oriented film.

4. The thin-film piezoelectric element as in claim 1, wherein the piezoelectric film is a c-plane single-oriented thin film.

5. The thin-film piezoelectric element as in claim 1, wherein the piezoelectric film includes at least one of lead zirconate titanate, lead strontium titanate, and lead titanate.

* * * * *